United States Patent [19]

Solomon et al.

[11] 3,959,733

[45] May 25, 1976

[54] DIFFERENTIAL AMPLIFIER

[75] Inventors: James E. Solomon, Saratoga; Ronald W. Russell, Sunnyvale, both of Calif.

[73] Assignee: National Semiconductor Corporation, Santa Clara, Calif.

[22] Filed: Feb. 12, 1975

[21] Appl. No.: 549,194

[52] U.S. Cl. ................................. 330/30 D; 330/35
[51] Int. Cl.² ........................................... H03F 3/45
[58] Field of Search ................ 330/30 D, 35, 38 M, 330/69

[56] References Cited
UNITED STATES PATENTS

| | | | |
|---|---|---|---|
| 3,395,358 | 7/1968 | Petersen | 330/30 D |
| 3,440,554 | 4/1969 | McGraw et al. | 330/30 D |
| 3,444,476 | 5/1969 | Leidich | 330/69 |
| 3,786,362 | 1/1974 | Marsh et al. | 330/30 D |
| 3,810,031 | 5/1974 | Poujois | 330/35 X |

OTHER PUBLICATIONS

Russell, et al., "A High–Voltage Monolithic Operational Amplifier," *IEEE Journal of Solid State Circuits*, Vol., SC–6, No. 6 Dec. 1971, pp. 352–357.
Woodward et al., "An Inexpensive Current–Voltage Booster for Electrochemical Instrumentation," *Analytical Chemistry*, Vol. 45, No. 2, Feb. 1973, pp. 435–436.

*Primary Examiner*—James B. Mullins
*Attorney, Agent, or Firm*—Lowhurst & Aine

[57] ABSTRACT

An operational amplifier includes an input differential stage formed of a differential pair of transistors, a tail current source supplying that differential pair, and a pair of current source loads, each connected to a respective one of the transistors of the differential pair. A common mode feedback loop is provided from a second stage of the differential amplifier to remove any excess current supplied by the tail current source which is not drawn by the current source loads. A single capacitor is employed for assymetric frequency compensation of the second stage, such that the above described common mode feedback can be applied without producing oscillations.

5 Claims, 2 Drawing Figures

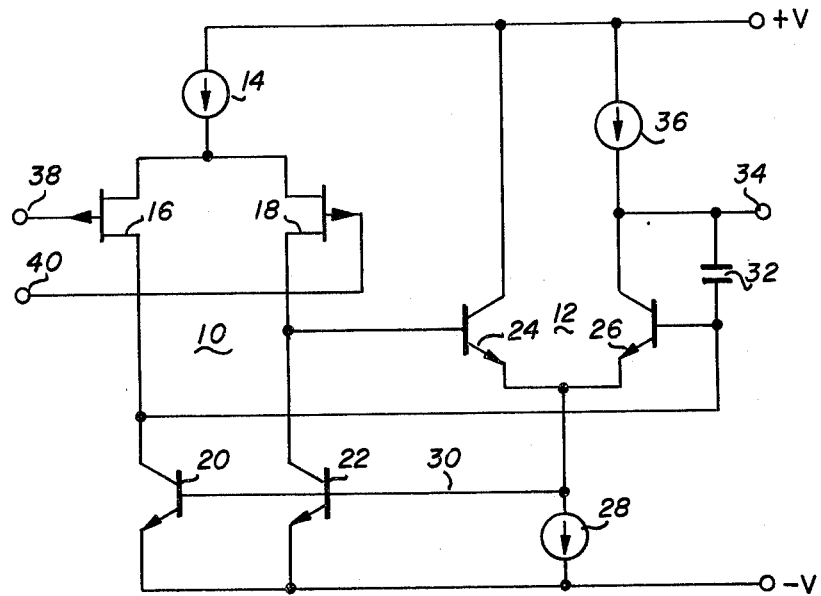
Fig_1
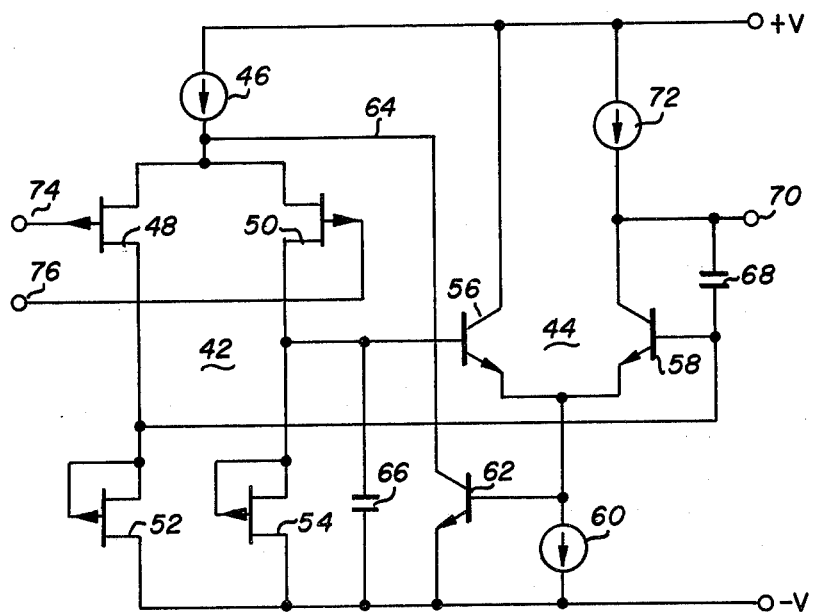
Fig_2

DIFFERENTIAL AMPLIFIER

BACKGROUND OF THE INVENTION

Field of the Invention

This invention relates generally to amplifier circuits, and more particularly to a differential amplifier having field effect transistor current source loads in the input stage thereof.

Prior Art

It is known that operational amplifiers with field effect transistor (FET) input stages are significantly faster than amplifiers with bipolar transistor input stages. This greater speed of the FET input stages results from the inherently lower ratio of transconductance-to-operating current in the FET as compared to the bipolar transistor.

In addition, the well known use of bipolar current source loads for the differential pair of an input stage of an amplifier results in high input noise, offset and drift. This occurs because the noise and offset of the bipolar current source load devices when referred to the input of the amplifier are amplified by the ratio of the bipolar transconductance to the input stage transconductance.

The use of resistor loads for an FET input amplifier does not introduce noise or drift, but results in a severe compromise between the range of the input voltage which can be employed and the gain of the amplifier. It can be appreciated that it is desirable to obtain a maximum input voltage range and a maximum amount of gain without one compromising the other.

Accordingly, it can be appreciated that a need exists for an amplifier input stage in which a compromise need not be made between the input voltage range and the gain thereof. Furthermore, a need exists for an amplifier input stage having less input noise, offset and drift than that found in bipolar current source loads.

SUMMARY OF THE INVENTION

Accordingly, it is a primary object of the present invention to provide an input stage for an amplifier having significantly less noise, offset and drift, than that found in amplifiers employing bipolar current source loads.

Another object of the present invention is to provide an input amplifier in which it is not necessary to compromise between the input voltage range and the gain of the amplifier.

These and other objects of the present invention are attained by employing FET, rather than bipolar, current source loads in the input stage of an amplifier, such that low noise, offset voltage and drift are achieved without a reduction in the dc gain of the amplifier. Such FET current source loads are practical only if current feedback is provided which shares all of the current supplied from a tail current source with the FET current source loads.

A feature of the present invention resides in the provision of asymetric frequency compensation which permits wide bandwidth and doubles the effective input stage transconductance.

The invention, however, as well as other objects, features and advantages thereof will be more fully realized and understood from the following detailed description, when taken in conjunction with the accompanying drawing, wherein:

BRIEF DESCRIPTION OF THE DRAWING

FIG. 1 is a schematic diagram of an operational amplifier constructed in accordance with the principles of the present invention.

FIG. 2 is a schematic diagram of a second embodiment of an operational amplifier constructed in accordance with the principles of the present invention.

Like reference numerals throughout the various views of the drawing are intended to designate the same element.

DETAILED DESCRIPTION OF THE PREFERRED EMBODIMENT

With reference to FIG. 1 in detail, there is shown an operational amplifier which is constructed in accordance with the principles of the present invention and includes an input amplifier stage 10 and a second stage 12 connected thereto. The input stage 10 includes a current source 14 which is connected between a positive supply of voltage and a differential pair of FET's 16 and 18. A pair of bipolar transistors 20 and 22 are connected as current source loads for the FET's 16 and 18, respectively. The transistors 20 and 22 are matched, such that the current through the FET 18 is equal to the current through the FET 16 during quiescent conditions.

Outputs of the input stage 10 are connectd to respective inputs of the second stage 12. The second stage 12 includes a pair of transistors 24 and 26 connected as a differential pair and a current source 28 connected between the differential pair and the negative voltage supply. A common mode current feedback is provided on a line 30 from the second stage 12 to the current source loads 20 and 22.

The second stage 12 is provided with assymetric frequency compensation by a capacitor 32 connected from the base of the transistor 26 to its collector, which collector provides an output on an output terminal 34. The capacitor 32 provides differential compensation for the second stage 12, such that a second capacitor is not required between the base and the collector of the transistor 24. Furthermore, the use of the single capacitor 32 to provide assymetric frequency compensation for the second stage 12 eliminates the need of a current source between the positive supply voltage and the collector of the transistor 24. A current source 36 is provided, however, between the positive supply voltage and the collector of the transistor 26.

As mentioned previously, the use of bipolar transistors as current source loads, such as the transistors 20 and 22, results in relatively high input noise, high offset voltage, and high offset voltage drift. This occurs because the noise and offset of the bipolar current source loads when referred to the input of the amplifier are amplified by the ratio of the bipolar transconductance to the input stage transconductance. That is, the noise and offset of the transistors 20 and 22 when referred to input terminals 38 and 40 of the amplifier are amplified by the ratio of their transconductance to the transconductance of the differential pair formed by the FET's 16 and 18. The circuit illustrated in FIG. 2 is significantly less noisy, has less offset voltage, and less offset drift than the circuit illustrated in FIG. 1, but is not as fast as the circuit illustrated in FIG. 1.

With reference to FIG. 2, there is shown a differential amplifier which is constructed in accordance with the principles of the present invention and includes an input amplifier stage 42 and a second stage 44 connected thereto. The input stage 42 includes a current source 46 which is connected between a positive supply voltage and a differential pair of FET's 48 and 50. A pair of FET's 52 and 54 are connected as current source loads for FET's 48 and 50, respectively. The FET's 52 and 54 are matched, such that the current through the FET 48 is equal to the current through the FET 50 during quiescent conditions if the base drive currents into the second stage 44 are considered negligible.

Outputs of the input stage 42 are connected to respective inputs of the second stage 44. The second stage 44 includes a pair of transistors 56 and 58 having their emitters connected through a current source 60 to the negative supply voltage. The emitters of the transistors 56 and 58 are also connected to the base of a transistor 62 having its emitter connected to the negative supply voltage and its collector connected to the tail current source 46 via a line 64. A current feedback is provided on the line 64 from the second stage 44 to the tail current source 46.

The current source 46 is designed such that it provides more current than the current drawn by the two circuit branches including the FET 48 and the FET 50. The current at the output of the tail current source 46 which is not drawn by the FET's 48 and 50 is removed as a current feedback on the line 64. Without the current feedback on the line 64, the current demanded by the FET current source loads 52 and 54 would not match the current supplied by the current source 46. As a result, the dc quiescent state of the circuit would be unstable. However, the current feedback provided on the line 64 elmininates this problem by drawing the excess current from the current source 46.

The base of the transistor 56 is connected through a frequency compensating capacitor 66 to the negative supply voltage. Also, the base of the transistor 58 is connected through a capacitor 68 to its collector which forms an output of the second stage 12 on an output terminal 70. A current source 72 is connected from the positive supply voltage to the collector of the transistor 58.

In operation, if the voltages on the bases of the transistors 56 and 58 attempt to increase, the voltage at their emitters will also attempt to increase. If it is assumed that a relatively small differential increase occurs at the emitters of the transistors 56 and 58, the base drive of the transistor 62 would be increased proportionally to increase the conduction level thereof. Accordingly, more current will flow through the feedback line 64, thereby drawing current from the current source 46 away from the FET's 48 and 50. The reduction of current through the FET's 48 and 50 will reduce the base drive to the transistors 56 and 58. Accordingly, the current feedback including the transistor 62 will draw a sufficient amount of current until the entire loop described above settles to a quiescent state. Therefore, the transistor 62 sinks quiescently a current which is equal to the difference between the current supplied by the tail current source 46 and the sum of the two currents through the FET's 52 and 54.

When a signal source having a frequency greater than 50 Hertz, for example, is connected between input terminals 74 and 76 of the input stage 42, a change will occur in the drain current of the FET 48 which will be proportional to the magnitude of the input signal. Under such input signal conditions, however, the change in the drain current of the FET 50 will be approximately equal to zero. The incremental drain current corresponding to the change which occurs in the drain current of the FET 48 is supplied to the base of the transistor 58. However, the incremental drain current does not appreciably alter the voltage on the base of the transistor 58, since it is conducted through the capacitor 68 to output terminal 70. This circuitry constitutes "assymetric frequency compensation" for the amplifier, whereby a single capacitor 68 provides differential compensation therefor. As in the circuit illustrated in FIG. 1, a capacitor is not required between the base and the collector of the transistor 56 and a current source is not required between the positive supply voltage and the collector of the transistor 56. The capacitor 66 is a relatively small valued capacitor and is employed only to minimize phase shift at relatively high frequencies.

From the above discussion, it can be appreciated that the current feedback on the line 64 permits the use of FET current source loads. The use of such FET current source loads results in low noise, low offset voltage, and low offset drift reflected to the inputs 74 and 76. Furthermore, the use of FET current source loads 20 and 22 permits maximum range without compromising gain. Assymetric frequency compensation of the circuit illustrated in FIG. 2 permits wide bandwidth and doubles the effective input stage transconductance thereof. More particularly, the capacitor 68 provides a frequency roll-off of six db per octave which is needed to allow the current feedback to be applied without causing oscillations.

The invention claimed is:
1. A differential amplifier comprising
   a. an input amplifier stage including
      1. a current source,
      2. a first pair of transistors connected to said current source and having one electrode of each forming the inputs of said differential amplifier, and
      3. a second pair of transistors each connected as current source loads for a respective one of said first pair of transistors,
   b. a third pair of transistors connected as a differential pair to the output of said input stage, and
   c. means for drawing current from said current source and responsive to a voltage change at the inputs of said third pair of transistors for changing the amount of current drawn from said current source, such that said current drawing means removes all of the current supplied by said current source which is not drawn by said first pair of transistors.
2. The differential amplifier of claim 1, wherein said first pair of transistors are field effect transistors.
3. The differential amplifier of claim 2, wherein said second pair of transistors are field effect transistors.
4. The differential amplifier of claim 1, wherein said current drawing means includes a transistor having its base connected to the emitters of said third pair of transistors and its collector connected to said current source.
5. A differential amplifier comprising
   a. an input amplifier stage including
      1. a current source,
      2. a first pair of transistors connected to said current source and having one electrode of each forming the inputs of said differential amplifier, and
3. a second pair of transistors each connected as current source loads for a respective one of said first pair of transistors, b. a third pair of transistors connected as a differential pair to the output of said input stage, and c. a capacitor connected between the base of only one of said third pair of transistors and its collector, which collector forms an output of said differential pair.

* * * * *